(12) United States Patent
Dash et al.

(10) Patent No.: US 8,324,756 B2
(45) Date of Patent: Dec. 4, 2012

(54) AUTOMATIC ON-CHIP DETECTION OF POWER SUPPLY CONFIGURATION-MODES FOR INTEGRATED CHIPS

(75) Inventors: Ranjit Kumar Dash, Tamil Nadu (IN); Lakshmanan Balasubramanian, Tamil Nadu (IN); Anand Devendra Kudari, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 858 days.

(21) Appl. No.: 12/245,776

(22) Filed: Oct. 6, 2008

(65) Prior Publication Data

US 2010/0085087 A1 Apr. 8, 2010

(51) Int. Cl.
*H02J 3/14* (2006.01)

(52) U.S. Cl. .......... 307/31; 307/100; 323/234; 323/265; 323/282; 323/901; 363/49

(58) Field of Classification Search .................. None
See application file for complete search history.

(56) References Cited

U.S. PATENT DOCUMENTS

| | | | |
|---|---|---|---|
| 8,026,636 B2 * | 9/2011 | Oh | 307/31 |
| 2008/0012543 A1 * | 1/2008 | Negoro | 323/272 |
| 2008/0136381 A1 * | 6/2008 | Yang et al. | 323/220 |
| 2009/0322297 A1 * | 12/2009 | Shiota | 323/282 |
| 2010/0060078 A1 * | 3/2010 | Shaw | 307/31 |
| 2010/0109624 A1 * | 5/2010 | Lourens et al. | 323/280 |

* cited by examiner

*Primary Examiner* — Rexford Barnie
*Assistant Examiner* — Justen Fauth
(74) *Attorney, Agent, or Firm* — Wade J. Brady, III; Frederick J. Telecky, Jr.

(57) ABSTRACT

A power management (PM) system architecture for a controlled SoC detects availability of power supply for signal-driving at a given node inside a chip, and uses a timer, a discharge mechanism with trigger for starting/stopping a discharge process, and a comparator for monitoring a measured voltage of an intended node during the discharge process. Enabling the discharge mechanism for a known time period helps detection. Power supply can be internally generated in the chip or from a source on board. The architecture detects if the node is driven or floating, an undriven floating node causing a dip in the measured voltage. The measured voltage does not have a dip when the node is driven. The architecture is also configured so that when there is a required on-board external power supply, an internal power supply is disabled to avoid a race-condition. The architecture obviates a dedicated IO pin for mode-indication.

3 Claims, 5 Drawing Sheets

AUTOMATIC ON-CHIP DETECTION OF POWER SUPPLY CONFIGURATION-MODES FOR INTEGRATED CHIPS

FIELD OF THE INVENTION

This invention relates generally to power management (PM) and on-chip detection of configuration-modes for integrated chips, e.g., RF integrated chips, and more particularly to automatic on-chip detection to provide the user the flexibility of running the RF chip from an internal regulator or an external supply such as but not limited to a regulator.

BACKGROUND OF THE INVENTION

It is known that for achieving power management in system-architectures in chips such as RF integrated chips, there are certain users that prefer to use the internal regulator mode while other users prefer to use an external regulator mode. When the RF chip is driven from an external source, the internal regulator should be switched off to avoid any current-overhead, and its output should be high-Z to ensure a no-racing condition between the internal and external regulators. This can be done if the internal regulator is disabled completely with minimum or zero quiescent current.

It is desirable to have a signal which can configure the chip into an "internal regulator" or "external regulator" mode. It is also desirable to have a "High Z" capability on the output in the internal regulator during OFF condition. Situations which need to be avoided include a race-condition at the regulator output during power up in an external regulator mode, and a high-current-state which may cause electro migration or other reliability issues every time the chip powers up, or even during operating conditions. It would be desirable if the chip could distinguish in a simple manner as to which mode it is in, i.e., external regulator mode, internal regulator mode and digital test mode Existing Solutions and Associated Problems One prior art method is to use software which indicates that the system is in an external regulator mode. However, the software for this purpose will generally work only after the chip wakes up. During wake up of the chip, there is a contention when the internal regulator is forced to be turned on while the external regulator is driving its output. Software can provide the required solution only to regulators that are not involved in power-up of the chip. Where software is used, the above method is not a preferred option since the software might need to be different for different customers owing to differences in their respective board configurations.

A second option is to use a dedicated IO pin in the chip. This IO cannot however be reused (INPUT/OUTPUT type). It is to be noted that this is an expensive solution particularly if the chip is IO limited.

A third option is to use an internal comparator which when driven from an external source, detects the internal and external configuration modes. In such case, the internal regulator output should be high "Z" to ensure that it does not draw current from the external regulator. Also the chip during "regulator OFF" condition has to contend with unknown voltage at the regulator output when the chip wakes up with "internal regulator mode". In this option however, the disadvantage is that the comparator scheme will falsely detect such conditions as "external regulator mode". It assumes a low impedance to ground when the output of any regulator is disabled. A typical prior art arrangement reflecting such a situation may be found in U.S. Pat. No. 7,013,396.

A fourth option is to use a series connected switch in the power path to avoid a race condition. However, this arrangement compromises voltage regulation as the load current passes though the switch which essentially has series switch resistance. Also, there is a need for a voltage detection mechanism which is not part of the prior art and assumes a low impedance to ground from the output of the different supplies. A typical prior art arrangement reflecting such a situation may be found in U.S. Pat. No. 4,843,224.

SUMMARY OF THE INVENTION

The present invention in its broad form provides a circuit internal to a chip, e.g., RF chip (which can be in an internal regulator configuration or external regulator configuration), to know the chip configuration on the customer board, to detect if the chip is in internal regulator configuration or external regulator configuration when the shut down signal or chip-enable signal to the chip is released. Based on the detection, the circuit switches off the internal regulator completely, and makes the internal regulator output high-impedance if the chip is in an external regulator mode. The present approach works without depending on any other signals and without need for an additional dedicated pin, and without any dedicated PAD requirement unlike as in prior art techniques.

The invention in one form resides in a power management (PM) system architecture for a controlled integrated chip which has an internal regulator configuration mode and an external regulator configuration mode, comprising: a comparator acting as a detector and a control circuit in said system architecture for detecting if the chip is in the internal regulator configuration mode or external regulator configuration mode when the chip receives a turn-on signal preparatory to a next chip-wakeup sequence, the system architecture being configured for selectively turning off the internal regulator configuration mode when the external regulator configuration mode is selected.

The invention in a second form resides in a power management system architecture for a controlled SoC including detection of availability of power supply for signal driving at a given node inside a chip, comprising: a timer; a discharge mechanism using a trigger for starting/stopping a discharge process; and, a comparator for continuously monitoring a measured voltage of an intended node during the discharge process, wherein said detection is made possible by enabling said discharge mechanism for a known time period.

The invention in a third form resides in a power management system architecture for a controlled SoC including detection of availability of power supply for signal driving at a given node inside a chip, comprising: a timer; a discharge mechanism using a trigger for starting/stopping a discharge process; a comparator for continuously monitoring a measured voltage of an intended node during the discharge process, wherein detection is made possible by enabling the discharge mechanism for a known time period; wherein the power supply can be internally generated in the chip or from an external source on board; the system architecture being configured to detect if the node is driven or floating, 'the node' not causing a dip in the measured voltage when the node is driven, 'the node' causing a dip in said measured voltage when the node is floating, the system architecture being also so configured that when there is a required on-board external power supply, an internal power supply can be disabled to avoid a race-condition.

Other variations of the architecture recited above are envisaged and are within the ambit of the invention. While the invention is described in connection with certain embodiments, it should be understood that the invention is not limited to any embodiment. On the contrary, the scope of the invention is limited only by the appended claims and the invention encompasses numerous alternatives, modifications and equivalents.

BRIEF DESCRIPTION OF THE DRAWING

A more detailed understanding of the invention can be had from the following description of embodiment/s to be understood in conjunction with the accompanying drawing wherein.

DETAILED DESCRIPTION

A detailed description of one or more embodiments of the invention is provided below in the context of the accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention.

The present invention may be practiced according to the claims without some or all of these specific details. For the purpose of clarity, technical material that is known in the technical fields related to the invention has not been described in detail so that the present invention is not unnecessarily obscured.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

Figure 1:
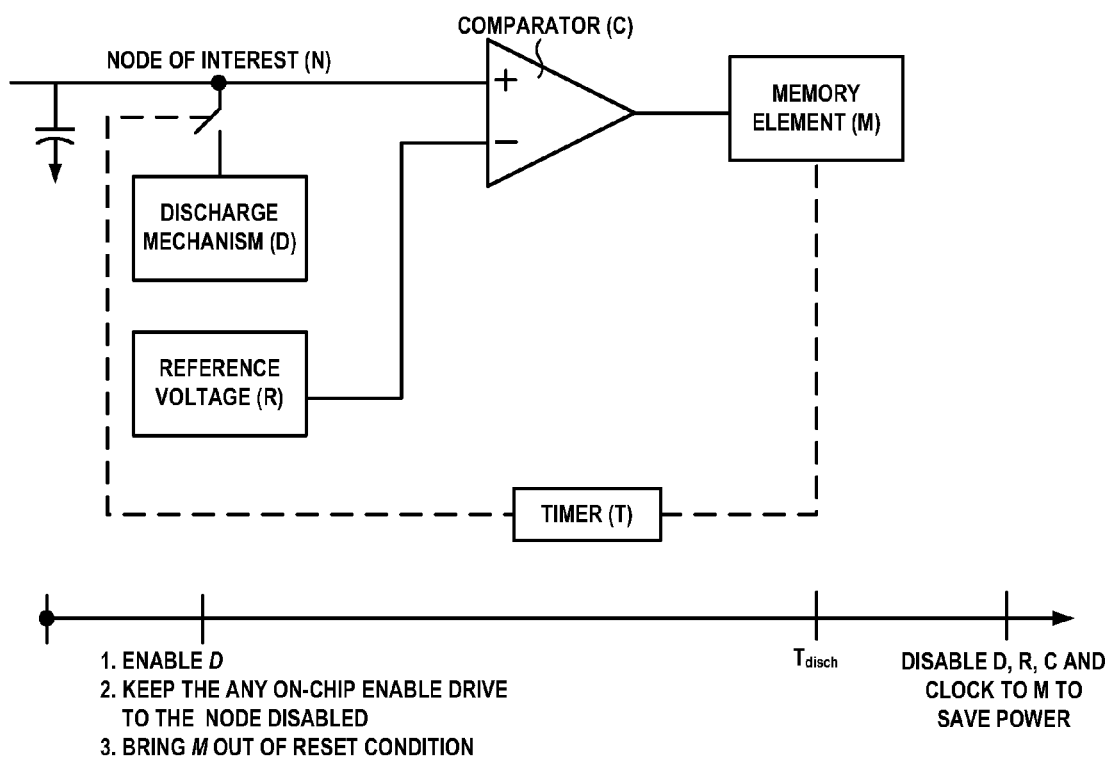
FIG. 1 shows a block diagram of the detection scheme in the context of the invention.

Detection of availability of power supply or signal-drive at a given node inside a chip (SoC, System on a chip):

FIG. 1 illustrates a detection scheme in the form of a block diagram in the context of the invention. The objective is to detect any supply or signal drive present on a given node (N) within a chip and use the detected information to assist in power management.

The outcome of detection can be true or false, true being where the node is driven by a source/driver (Driven), and false being where there is a residual charge on the node without any physical driver/source (Floating). Detection is made possible by a discharge mechanism that is enabled for a known period of time ($T_{disch}$). If the node is "Driven" then the discharge process will not cause a dip in voltage of the node unlike the case when it is "Floating" (or not Driven). If the node is "Floating" then the discharge process will cause a dip in the voltage which is measurable and proportional to the time of discharge ($T_{disch}$) and the amount of effective capacitance ($C_{eff}$) at the node.

A comparator (C) based system for detecting whether the dip in the voltage of the node for a given $C_{eff}$ and $T_{disch}$ is equal to or more than a reference voltage (R), will enable making a detection/decision regarding whether that node is "Driven" or "Floating". At the end of detection, the result is stored in a memory element (M) say a flip flop or latch, which can be used for any of the four various Applications/purposes which include the following:

Application A1. Disabling of other potential sources or drivers to avoid racing condition.

Application A2. Enabling the intended sources or drivers only if the node is "floating".

Application A3. Measurement of node capacitance ($C_{eff}$) by monitoring the rate of discharge, and, Application A4. Measurement of any of the three variables namely, node capacitance ($C_{eff}$), time between two events ($T_{disch}$), and effective resistance from node to ground or any other known potential (R) while the others are known.

A timer (T), discharge mechanism (D), comparator (C), reference (R) and memory element (M) are needed for this scheme to be implemented. The timer (T) can be realized by any of the following two schemes but not limited thereto: T1 which is a digital counter that is run by a clock signal of known frequency (f) or, T2 which is an inverter or buffer chain or a RC (delay) network The discharge mechanism (D) can be built by any of the following two schemes, but not limited thereto: D1 which is a known resistance to ground through a switch, or D2 which is a known current sink with a disable mechanism. Each of the above will need a trigger mechanism to start and stop the discharge process.

A comparator is required to continuously monitor the voltage of the intended node during the discharge process. A reference voltage or current is needed for the comparison process to work. This comparator and reference can be implemented by any of the following three schemes, but not limited thereto: CR1 which is a differential comparator and needs a reference, or, CR2 which is a simple digital inverter or buffer with its switching threshold performing the function of a reference (It is made possible in case the discharge is made complete or near complete by suitable choice of $T_{disch}$ and $C_{eff}$), or, thirdly CR3 which is a latch based comparator that can also integrate the function of the memory element (M). It is noted that comparators CR1 and CR2 need a separate memory element (latch or a flip flop).

It is to be noted that the proposed scheme saves at least one external interface (package ball or pin) that might be needed by the system to identify the different modes of operation. The scheme can be extended to any combination of multiple of power supplies or signal drivers as long as they are enabled in a known timing sequence, but not simultaneously.

The following are additionally noted. The discharge path will have a relatively large width resistor to support current discharge and a relatively large pull down transistor switch. The present approach will easily reveal the scheme if the initial power up currents are monitored. A large discharge will show up for a short time. Also, when operating in external regulator mode, internal regulator is switched OFF. Hence observing the change in the quiescent current may also reveal the scheme.

The novel detection scheme presented herein offers at least the following advantages:
1. Enables a customer to choose between internal/external regulator without consequences of any additional current.
2. Does not put any architectural or design constraint on the regulator design.
3. Saves a pin and an IO for detecting digital test modes in which a regulator output is forced from an external source.
4. Enables a customer to use a standard set of host commands and avoids any vendor-specific customizations.

Figure 2:
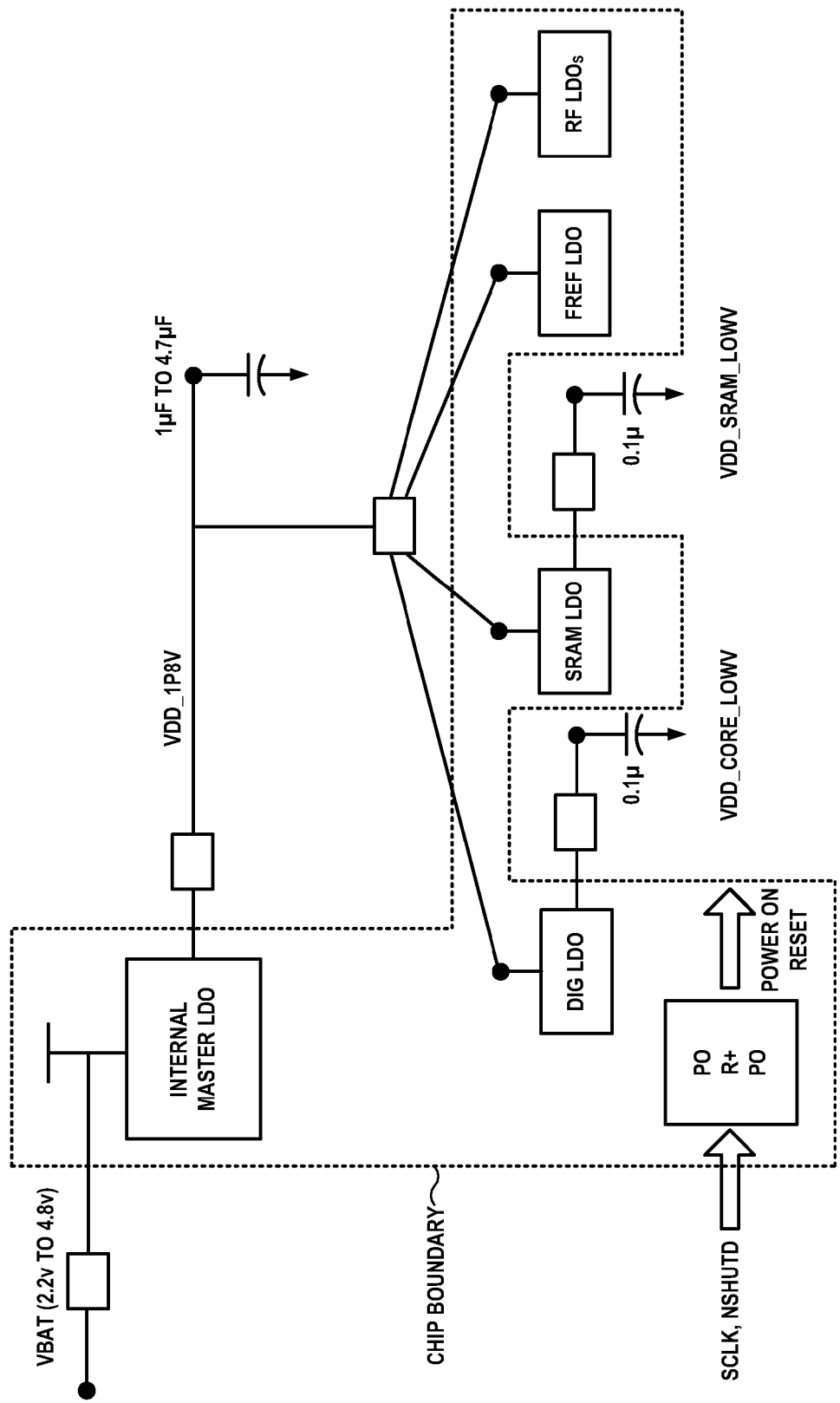
FIG. 2 illustrates a power management (PM) system of a SoC with all internal supplies derived from an external battery.

FIG. 2 shows a PM system for a SoC with all internal supplies like internal master LDO (MLDO) supplied by a battery (VBAT) and several other LDOs like DIG LDO, SRAM LDO, FREF LDO and various RF LDOs for a multi radio system all in turn powered by the MLDO output (VDD_1P8V). DIGLDO output (VDD_CORE_LOWV) supplies to all the digital logic in the system, SRAM LDO (VDD_SRAM_LOWV) supplies to all the memories, FREF LDO supplies to the reference clock system and RF LDO to various analog blocks in the RF system. All of these LDOs are powered up in a sequence during the system start up by an existing Power on Reset and Power on Logic (POR+POL) circuit using an internal timer (T) based on an accurate clock (SCLK) and the chip enable signal (NSHUTD). In the case when the on-chip MLDO is to be used, the detection circuit on VDD_1P8V node should result in a state in which the MLDO is enabled by POR.

Figure 3:
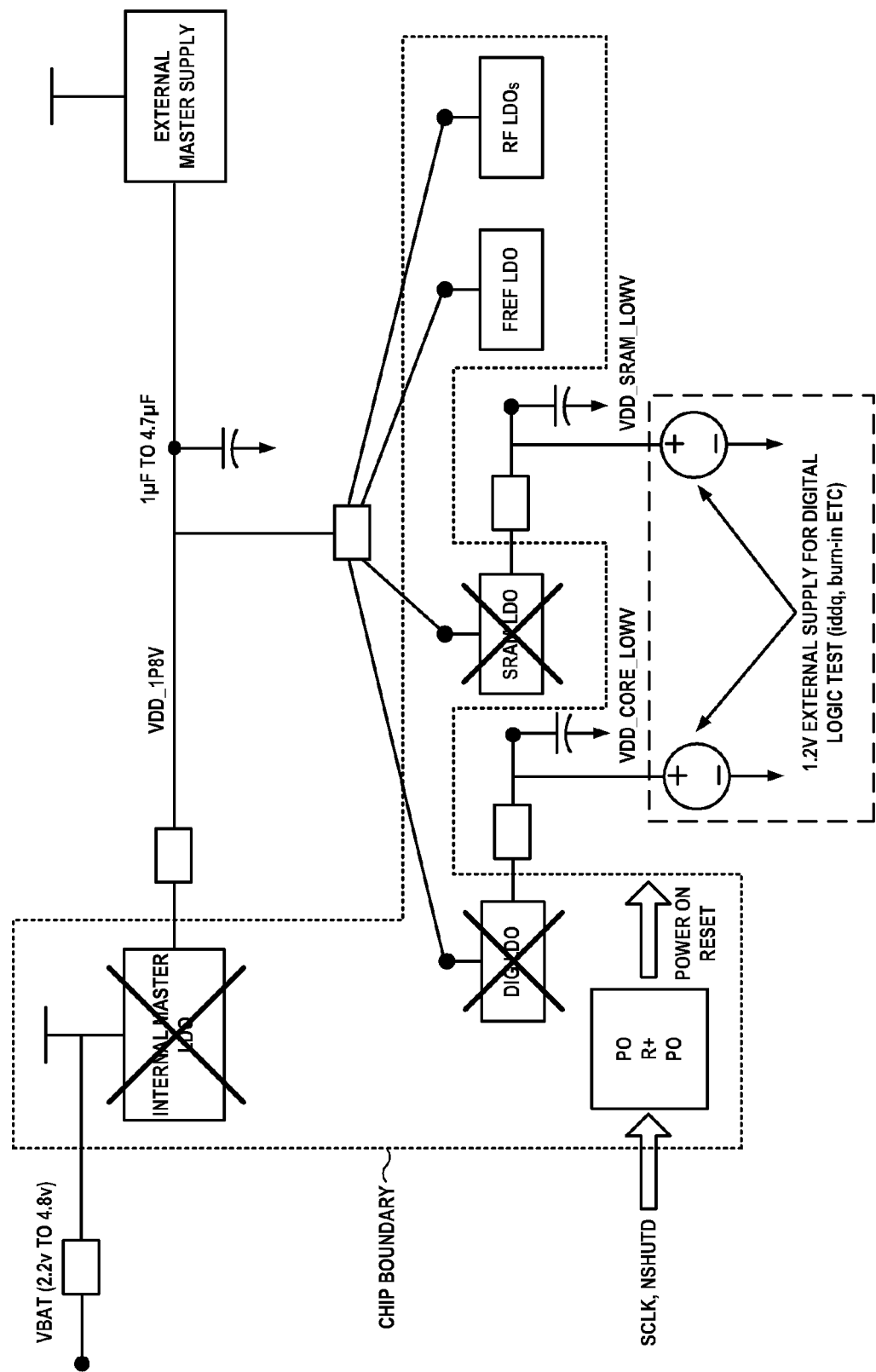
FIG. 3 illustrates a PM system of a SoC with external supplies.

FIG. 3 shows a different scenario for the same chip but to be powered up by external sources by-passing the on-chip LDOs like MLDO, DIG LDO and SRAM LDO by forcing their outputs. Depending on the voltage levels to which the external forcing is done with respect to their regular operating output voltage level, this can cause a racing condition between the external source and the internal LDOs. To avoid this under the external force condition, the internal LDOs need to be disabled (shown in FIG. 3 as crossed off marks). In conventional systems there is a dedicated chip level pin provided which can be forced to distinct voltage levels at the board level to differentiate between the two operating scenarios described above. The proposed scheme illustrated in FIG. 1 applied independently to the output of MLDO and DIGLDO (namely, VDD_1P8V and VDD_CORE_LOWV nodes) can obviate the need of this additional pin and allows automatic on-chip detection of the external supply mode, the status of which can be used to enable or disable the internal LDOs by the POR+POL (T) circuit. In this scenario, the only requirement is that the detection should be completed before the time when the internal LDOs are powered up in the normal sequence of power up and should be latched or kept in a memory until the chip is again brought through a power down/power up cycle.

Figure 4:
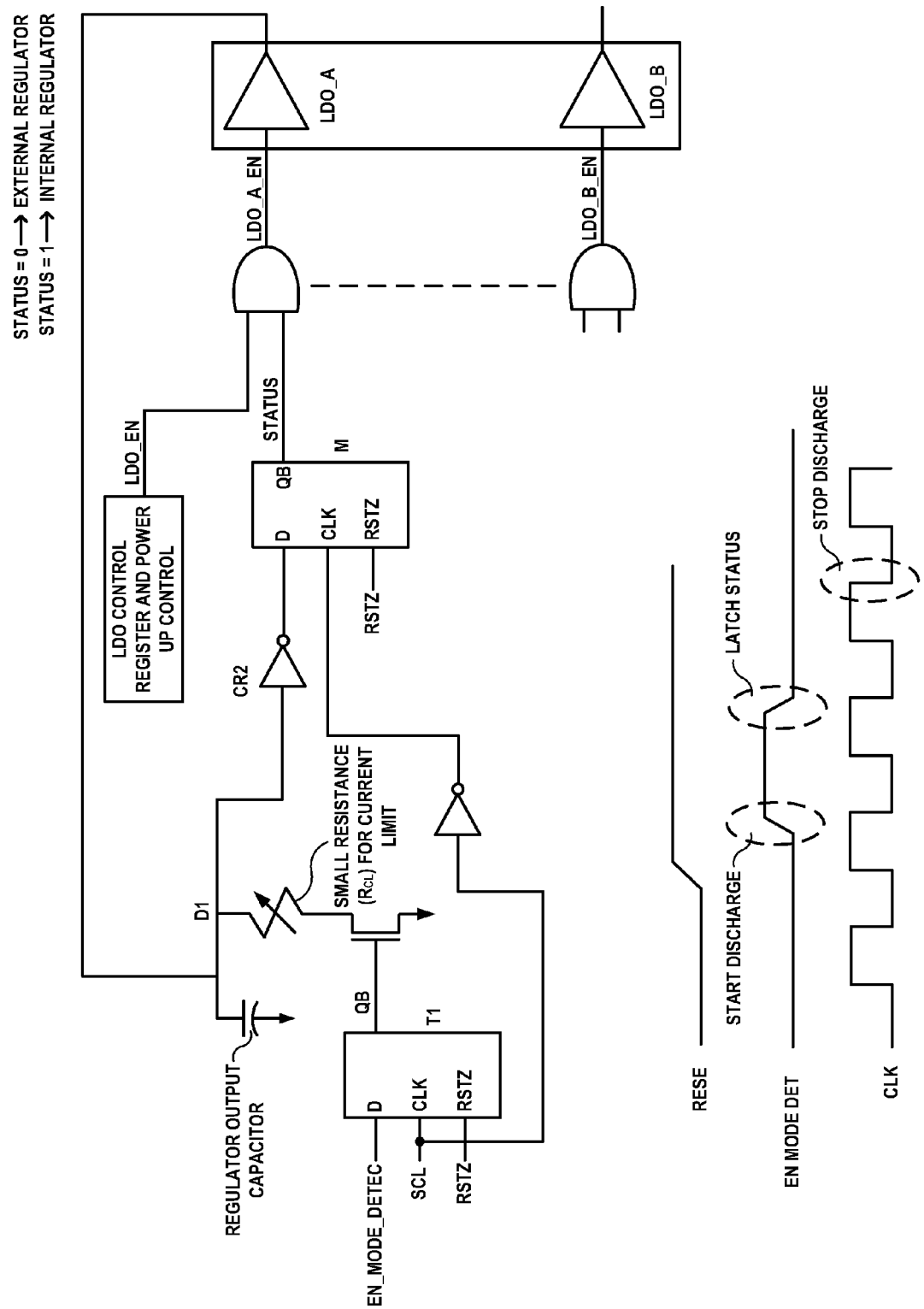
FIG. 4 illustrates a detection scheme with near complete discharge enabled by a timer (T) and discharge circuit, and a simple inverter (CR); and, FIG. 5 illustrates a detection scheme with partial discharge enabled by the time (T) and discharge circuit $R_{CL}$, and a comparator with a known reference VREF (CR).

FIG. 4 illustrates a detection scheme with near complete discharge enabled by a timer (T) and discharge circuit (D), and a simple inverter (CR) as a comparator with its switching threshold as an inbuilt reference. FIG. 4 further shows one possibility of the implementation of the proposed solution which makes the building blocks, a counter based timer (T1) using a clock with known frequency, a discharge mechanism (D1) formed by a resistor and a series switch, an inverter as a comparator with its switching threshold as an inbuilt reference (CR2), and a flip flop (M) as a memory element. When the chip is powered up until the timer reaches its final count, the series switch in the discharge mechanism (D1) is kept on to allow discharging of the node. Once the final count is reached, the discharge mechanism is disabled by switching off the series switch and then latching or storing the node-voltage in the memory element (M) which was reset as soon as the chip was powered up. In this scheme, if the node being discharged is floating or undriven due to the absence of external driver and also because the internal driver will not be enabled until after the detection process is completed, then the memory element will always have a logic '0' stored in it. On the contrary, if the node is driven by an external source (or any other source) starting any time before the detection process is completed, the flip flop will change its state from logic '0' to logic '1' at the end of detection process. Hence the state of this memory element will indicate the scenario under which the chip is intended to work and this information can be used to keep the internal LDOs disabled if there is a driver or external LDO already. If not, then the timer will proceed to go through its regular power up sequence to enable the internal LDOs, but always after the detection process is done.

Figure 5:
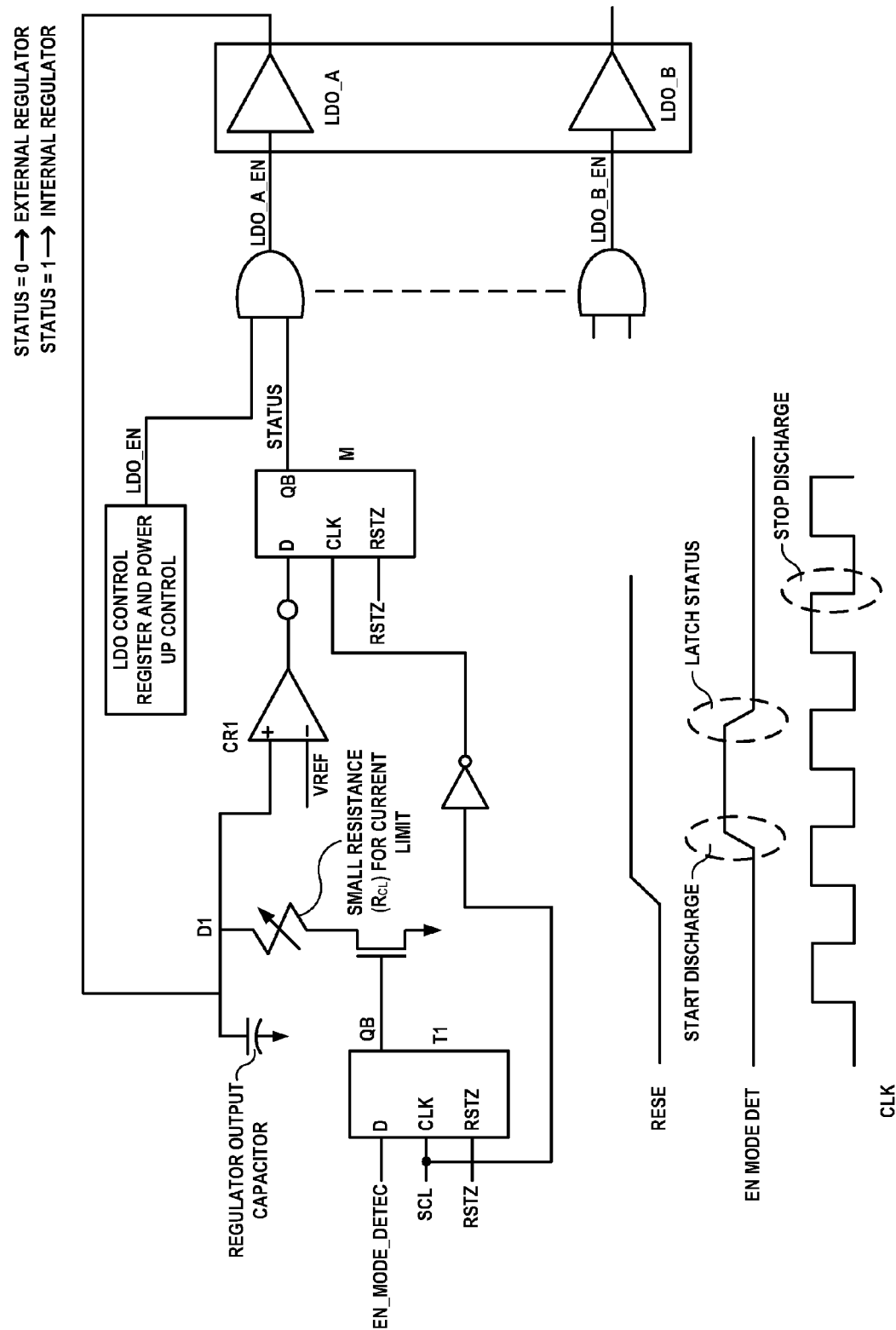

FIG. 5 illustrates a detection scheme with partial discharge enabled by the time (T) and discharge circuit $R_{CL}$, and a comparator with a known reference VREF (CR). The scheme of FIG. 5 can support a smaller discharge. FIG. 5 also illustrates one possibility of the implementation of the proposed solution which makes the building blocks, a counter based timer (T1) using a clock with known frequency, a discharge mechanism (D1) formed by a resistor and a series switch, a comparator (C) with a known reference voltage (R) forming CR1, and a flip flop (M) as a memory element. When the chip is powered-up until the timer reaches its final count, the series switch in the discharge mechanism (D1) is kept on to allow discharging of the node. Once the final count is reached the discharge mechanism is disabled by switching off the series switch and then latching or storing the node voltage in the memory element (M) which was reset as soon as the chip was powered up. In this scheme, if the node being discharged is floating or undriven due to the absence of external driver and also due to the internal driver not being enabled until after the detection process is completed, then the memory element will always have a logic '0' stored in it. On the contrary, if the node is driven by a external source (or any other source) starting any time before the detection process is completed, the flip flop will change its state from logic '0' to logic '1' at the end of detection process. Hence the state of this memory element will indicate the scenario under which the chip is intended to work and this information can be used to keep the internal LDOs disabled if there is a driver or external LDO already. If not, then the timer will proceed to go through its regular power up sequence to enable the internal LDOs, but always after the detection process is done.

Applications A1 and A2 discussed supra can be implemented together in a power management system of a complex SoC (System on Chip) where the power supply can be internally generated on chip or from an external source on board. In a particular scenario, this scheme is used to detect an external power supply that is available and stabilized before the internal supply can be enabled. This enables flexibility of choosing the on-board external supply or an on-chip internal supply for a given SoC. In case of on-board external supply meeting the pre-conditions specified above, it can be detected using the proposed scheme and the internal supply can be disabled to avoid a race-condition. This information can also be used by the SoC/firmware to configure the system accordingly. Such a scenario is shown in FIG. 2 and FIG. 3, and the proposed scheme is shown in FIGS. 4 and 5.

The following shows a specific application scenario in mobile SoCs:
Customer "A" prefers internal regulator mode while Customer "B" prefers an external regulator mode. In case of customer "B", the customer prefers that the internal regulator is OFF without any current overhead.

This can be achieved with the help of a dedicated signal which can configure the chip into an "internal regulator" or "external regulator" mode.

This requirement also needs a "High Z" capability on the output of internal regulator during OFF condition.

Under this condition there is a possibility of race condition at the regulator output during power up in an external regulator mode.

This can cause a high current state which may cause electro migration and other reliability issues every time the chip powers up.

The present invention enables to easily distinguish between external regulator mode, internal regulator mode and digital test modes during power up.

Shortcomings of existing prior art solutions include the following (and are obviated in the present approach) and are also shown in the comparison table that follows:

1. Software indicating external regulator mode:
   a. Software will work only after the chip wakes up. During wake up, there is a contention when internal regulator is forced turned on, while external regulator is driving its output.
   b. Not a preferred option as the software needs to be different for different customers.
   c. Customer has the burden of maintaining compatibility in software for various hardware platforms.
2. Pin indicating various modes:
   a. Requires a dedicated pin, to indicate certain mode;
   b. Expensive solution particularly if the chip is IO limited.
3. Internal comparator detects the modes:
   a. Internal regulator output should be high "Z" during "regulator OFF" condition with unknown voltage at the regulator output when the chip wakes up with "internal regulator mode". The comparator scheme will falsely detect such conditions as "external regulator mode".
   b. It assumes a low impedance to ground from the output of any regulator in off-mode.
4. Put a series switch in series with power path to avoid race condition:
   This compromises voltage regulation as the load current passes though this series switch. Also, for controlling the switch, there is needed an additional control signal, the generation of which is not discussed. It assumes a low impedance to ground from the output of the different supplies.

Comparison Table

| Metric | Proposed Solution | Existing Prior Art Solution |
| --- | --- | --- |
| Cost | No dedicated pin/ball requirement. | Requires one dedicated pin and a dedicated IO, which adds to package cost and may not be feasible in IO limited cases. |
| Robustness of detection mechanism | Very robust; Discharge resistance $R_{CL}$ can be adjusted to meet faster discharge or a known current limitation. | Potential false detection as the output is "high Z" during OFF condition. |
| Device reliability | No race condition, and hence no reliability issues due to high current. | Electro migration risk due to high current during race condition. Can be mitigated by making the internal regulator output impedance higher to reduce the current. Puts a constraint on the regulator architecture and design. |
| Regulation | Does not compromise with performance of internal or external regulation. | Regulation is compromised due to series switch-resistance. [Vide: U.S. Pat. No. 4,843,224] |

In the foregoing detailed description of embodiments of the invention, various features are grouped together in a single exemplary embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of embodiments of the invention, with each claim standing on its own as a separate embodiment. It is understood that the above description is intended to be illustrative, and not restrictive. It is intended to cover all alternatives, modifications and equivalents as may be included within the spirit and scope of the invention as defined in the appended claims. Many other embodiments will be apparent to those of skill in the art upon reviewing the above description. The scope of the invention should therefore be determined with reference to the appended claims, along with the full scope of equivalents to which such claims are entitled. In the appended claims, the terms "including" and "in which" where present, are used as the plain-English equivalents of the respective terms "comprising" and "wherein," respectively. Moreover, the terms "first," "second," and "third," etc., if used are merely labels, and are not intended to impose numerical requirements on their objects.

The invention claimed is:

1. An integrated circuit device capable of being powered by either an internal power supply or an external power supply, comprising:
   an internal power supply;
   a node coupled to the internal power supply and capable of being coupled to an external power supply;
   a power management system for detecting whether an external power supply is coupled to said node during start-up of the integrated circuit device prior to enabling the internal power supply, the power management system including:
   a discharge circuit for discharging the node for a predetermined discharge time during start-up of the integrated circuit;
   a comparator coupled to the node for determining during the predetermined discharge time whether the node is driven by an external power supply and providing a first output signal when the node is driven by an external power supply and a second output signal when the node is not driven by an external power supply.

2. The integrated circuit device of claim 1, wherein the internal power supply is a low dropout regulator (LDO).

3. The integrated circuit device of claim 1, wherein the internal power supply is not enabled during start-up of the integrated circuit device when the comparator provides the first output signal in response to the node being driven by an external power supply and is enabled during start-up of the integrated circuit device when the comparator provides the second output signal in response to the node not being driven by an external power supply.

* * * * *